United States Patent [19]

Takeda et al.

[11] Patent Number: 5,319,591

[45] Date of Patent: Jun. 7, 1994

[54] MEMORY MODULE

[75] Inventors: Takashi Takeda; Youichi Ushida, both of Tokyo, Japan

[73] Assignee: Oki Electric Industry Co., Ltd., Tokyo, Japan

[21] Appl. No.: 993,847

[22] Filed: Dec. 21, 1992

[30] Foreign Application Priority Data

Dec. 26, 1991 [JP] Japan .................................. 3-344612

[51] Int. Cl.$^5$ ............................................... G11C 5/06
[52] U.S. Cl. .......................................... 365/63; 365/51
[58] Field of Search ....................... 365/72, 63, 51, 52, 365/226

[56] References Cited

U.S. PATENT DOCUMENTS

| | | | |
|---|---|---|---|
| 4,656,605 | 4/1987 | Clayton | 365/52 |
| 5,040,143 | 6/1991 | Matsumura | 365/63 |
| 5,144,578 | 9/1992 | Sakagami | 365/63 |
| 5,164,916 | 11/1992 | Wu | 365/52 |

OTHER PUBLICATIONS

"Memory Module (Oki Semiconductor)", Oki Electric Industry Co., Ltd., First Edition, Jul. 1990, pp. 108–119 and pp. 165–173.

Primary Examiner—Eugene R. LaRoche
Assistant Examiner—Zarabian, A.
Attorney, Agent, or Firm—Spencer, Frank & Schneider

[57] ABSTRACT

A memory module includes a substrate having a common address line and first and second separate voltage lines. The substrate additionally has first and second voltage terminals which are maintained at a first predetermined potential and which are respectively connected to the first and second separate voltage lines. First and second memory devices are mounted on the substrate. The first memory device has a first data lead terminal, a first control input lead terminal, a first address input lead terminal and a first voltage lead terminal, the first address input lead terminal being connected to the common address line and the first voltage lead terminal being connected to the first separate voltage line. The second memory device has a second data lead terminal, a second control input lead terminal, a second address input lead terminal and a second voltage lead terminal, the second address input lead terminal being connected to the common address line and the second voltage lead terminal being connected to the second separate voltage line.

23 Claims, 5 Drawing Sheets

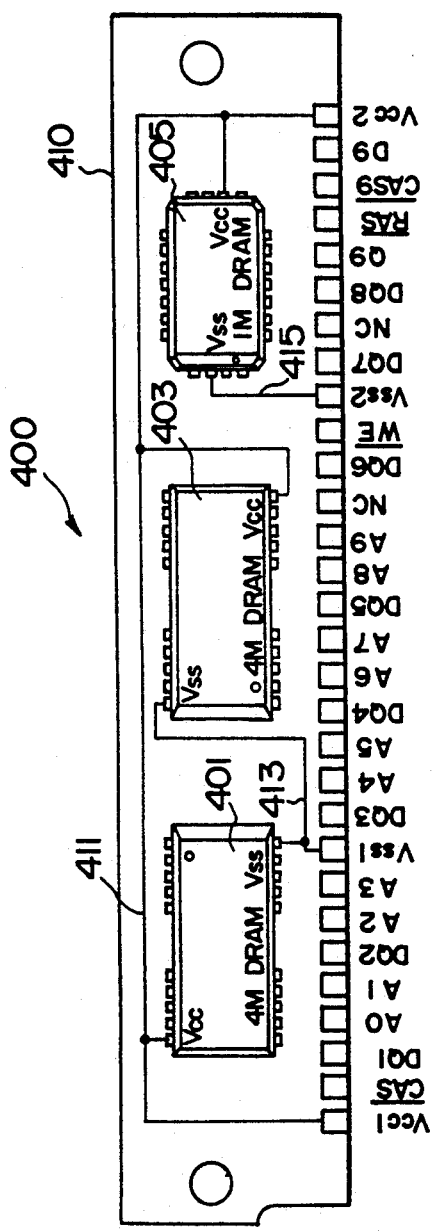
FIG. 4
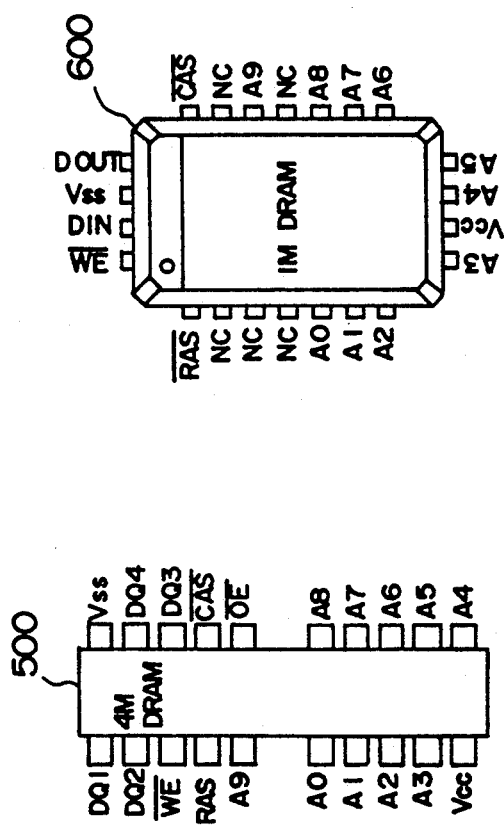
FIG. 6
FIG. 5

MEMORY MODULE

BACKGROUND OF THE INVENTION

1. Field of the Invention

The present invention relates to a memory module comprising a printed circuit board formed by printing voltage terminals, ground terminals and various signal terminals (data terminals, control signal input terminals, address signal input terminals, etc.) on a substrate, the terminals being electrically connected to an external mother printed circuit board, and a plurality of memory devices (DRAM, SRAM, etc.) mounted on the printed circuit board.

2. Description of the Related Art

An example of a memory module is disclosed in U.S. Pat. No. 4,656,605, of which the entire disclosure is incorporated herein by reference.

An OKI Data Book entitled "MEMORY MODULE (FIRST EDITION)" issued in July, 1990 (of which the entire disclosure is incorporated herein by reference) also describes various kinds of memory modules. There have been known, for example, a 1 Mega-word by 9 bit DRAM module (Model No. MSC2312A manufactured by Oki Electric Industry Co., Ltd.) having a printed circuit board with nine 1 Mb DRAMs mounted thereon, a 1 Mega-word by 9 bit DRAM module (Model No. MSC2359 manufactured by Oki Electric Industry Co., Ltd.) referred to as a "three chip pack", which has a printed circuit board with two 4 Mb DRAMs and a 1 Mb DRAM mounted thereon, and a 256 Kiloword by 36 bit DRAM module (Model No. MSM2320A manufactured by Oki Electric Industry Co., Ltd.) called a "multi-nine", which has eight 1 Mb DRAMs and four 256 Kb DRAMs mounted thereon.

The mounting of all kinds of memory devices (such as those different in maximum access time from each other, or those whose makers are different from one another) on these memory modules is not necessarily allowed even if these memory modules are identical in capacity to each other. It is desirable to mount memory devices of Model Nos. compatible in temperament or characteristics, preferably, memory devices identical in Model No. to each other. However, memory devices which are different in Model No. from each other are needed in some memory modules, including 4MDRAMs and a 1MDRAM in a "three chip pack" and 1MDRAMs and 256KDRAMs in a "multi-nine". It has thus been desired from the standpoint of memory module design to enable memory devices to be combined in a memory module without considering whether or not the memory devices are compatible in temperament.

SUMMARY OF THE INVENTION

Accordingly, it is an object of the present invention to consider how different kinds of memory devices in a memory module affect one another and to provide an improved memory module having a structure or an arrangement which can be manufactured without regard to the compatibility in temperament or characteristics between respective memory devices.

A memory module according to the invention includes a substrate having a common address line and first and second separate voltage lines, the substrate further having first and second voltage terminals to be respectively maintained at a first predetermined potential, the first and second voltage terminals being respectively connected to the first and second separate voltage lines; a first memory device, mounted on the substrate, having a first data lead terminal, a first control input lead terminal, a first address input lead terminal and a first voltage lead terminal thereof, the first address input lead terminal being connected to the common address line, the first voltage lead terminal being connected to the first separate voltage line; and a second memory device, mounted on the substrate, having a second data lead terminal, a second control input lead terminal, a second address input lead terminal and a second voltage lead terminal thereof, the second address input lead terminal being connected to the common address line, the second voltage lead terminal being connected to the second separate voltage line.

BRIEF DESCRIPTION OF THE DRAWINGS

The above and other objects, features and advantages of this invention will become apparent from the following description and the appended claims, taken in conjunction with the accompanying drawings, in which:

FIG. 4 is a functional block diagram showing the structure of a memory module according to a first embodiment of the present invention;

FIG. 5 is a layout drawing of the pin assignment of a certain DRAM;

FIG. 6 is a layout drawing of the pin assignment for another DRAM;

DETAILED DESCRIPTION OF THE PREFERRED EMBODIMENTS

Figure 1:
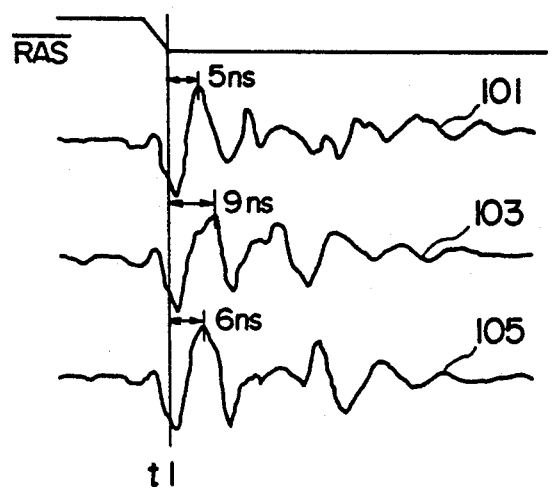
FIG. 1 is a timing chart for describing the relationship between various noises developed in ground lines of memory modules in comparison with a control signal.
Figure 2:
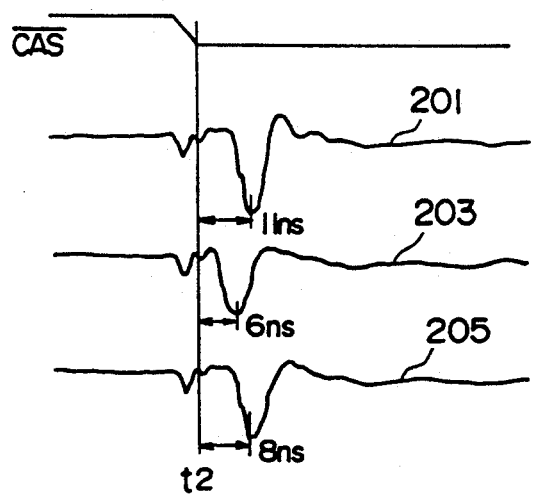
FIG. 2 is a timing chart for describing the relationship between various noises generated in ground lines of memory modules in comparison with a second control signal in one situation.
Figure 3:
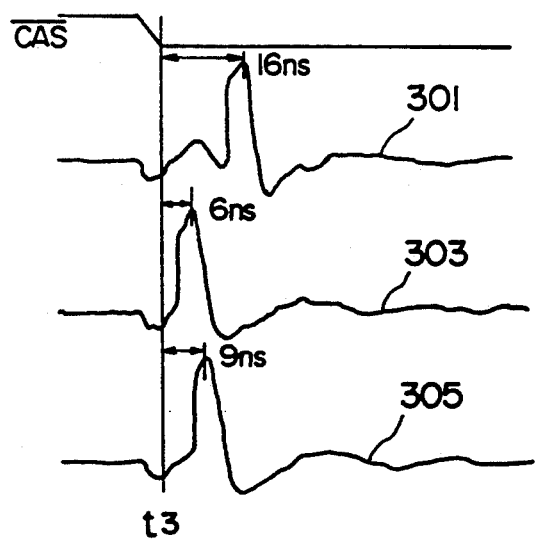
FIG. 3 is a timing chart for describing the relationship between various noises developed in ground lines of memory modules in comparison with the second control signal in another situation.

FIGS. 1, 2 and 3 are timing charts for describing the relationships between various noises developed in the ground patterns or lines of three kinds of memory modules each having nine 1MDRAMs, in comparison with control signals. FIG. 1 shows the manner in which the potential level of a ground pattern or line varies owing to various ground noises produced when the respective sense amplifiers of the nine memory devices are operated after a $\overline{RAS}$ (row address strobe) signal, which is supplied to a $\overline{RAS}$ control terminal so as to activate the respective sense amplifiers of the nine memory devices mounted on the memory module, has been changed from a high logic level to a low logic level. A waveform 101 illustrates a variation in the potential of a ground line of a 1 Mega-word by 9 bit DRAM module MSC2312 (hereinafter called a "first memory module") having nine 1 Mb DRAMS (Model No. MSM511000, first generation 1MDRAMs manufactured by Oki Electric Industry Co., Ltd.) mounted thereon, each having a maximum access time $t_{RAC}$ of 100 ns (nanosecond). Further, a waveform 103 illustrates the variation in potential of a ground line of a 1 Mega-word by 9 bit DRAM module MSC2312B (hereinafter called a "second memory module") having nine 1Mb DRAMS (Model No. MSM511000B, third generation 1MDRAMs manufactured by Oki Electric Industry Co., Ltd.) mounted thereon, each having a maximum access time $t_{RAC}$ of 80 ns (nanosecond). Furthermore, a waveform 105 illustrates the variation in potential of a ground line of a 1 Mega-word by 9 bit DRAM module THM511000A (hereinafter called a "third memory module") having nine 1Mb DRAMS (Model No. TC511000A, manufactured by TOSHIBA CORP.) mounted thereon, each having the maximum access time of 80 ns (nanosecond).

As will be apparent from FIG. 1, the potentials of the ground lines of the first, second and third memory modules are respectively maintained at a substantially ground level prior to the period of a change in the $\overline{RAS}$ signal from the high logic level to the low logic level. Further, the potentials of the ground lines of the first, second and third memory modules vary in sequences substantially different from each other after a time t1 at which the $\overline{RAS}$ signal has been brought to the low logic level. That is, the waveform 101 representative of the variation in potential of the ground line of the first memory module changes in a first sequence which has an initial positive peak, owing to positive voltage noises produced by the memory devices, after 5 ns have elapsed since the time t1. Further, the waveform 103 indicative of the variation in potential of the ground line of the second memory module changes in a second sequence which has an initial positive peak after 9 ns have elapsed since the time t1. Furthermore, the waveform 105 representative of the variation in potential of the ground line of the third memory module changes in a third sequence which has an initial positive peak after 6 ns have elapsed since the time t1.

FIG. 2 shows the manner in which the potential levels of the ground patterns or lines vary owing to various ground noises generated when data representative of "1" corresponding to a high logic level is output after a $\overline{CAS}$ (column address strobe) signal, which is supplied to a $\overline{CAS}$ control terminal so as to read desired data from the nine memory devices mounted on the memory module, has been changed from a high logic level to a low logic level. A waveform 201 illustrates the variation in potential of the ground line of the first memory module, which has been described with reference to FIG. 1. Further, a waveform 203 shows the variation in potential of the ground line of the second memory module, which has been described with reference to FIG. 1. Furthermore, a waveform 205 indicates the variation in potential of the ground line of the third memory module, which has been described with reference to FIG. 1.

As will be apparent from FIG. 2, the potentials of the ground lines of the first, second and third memory modules are respectively maintained at a substantially ground level prior to the period of a change in the $\overline{CAS}$ signal from the high logic level to the low logic level. Further, the potentials of the ground lines of the first, second and third memory modules change in sequences substantially different from each other after a time t2 at which the $\overline{CAS}$ signal has been brought to the low logic level. That is, the waveform 201, indicative of the variation in potential of the ground line of the first memory module, changes in a fourth sequence which has a negative peak, owing to negative voltage noises generated by the memory devices, after line have elapsed since the time t2. Further, the waveform 203, indicative of the variation in potential of the ground line of the second memory module, changes in a fifth sequence which has a negative peak after 6 ns have elapsed since the time t2. Furthermore, the waveform 205, representative of the variation in potential of the ground line of the third memory module, changes in a sixth sequence which has a negative peak after 8 ns have elapsed since the time t2.

FIG. 3 shows the manner in which the potential levels of the ground patterns or lines vary owing to various ground noises generated when data representative of "0" corresponding to a low logic level is output after a $\overline{CAS}$ (column address strobe) signal, which is supplied to a $\overline{CAS}$ control terminal so as to read data from the nine memory devices mounted on the memory module, has been changed from a high logic level to a low logic level. A waveform 301 shows the variation in potential of the ground line of the first memory module, which has been described with reference to FIG. 1. Further, a waveform 303 illustrates the variation in potential of the ground line of the second memory module, which has been described with reference to FIG. 1. Furthermore, a waveform 305 depicts the variation in potential of the ground line of the third memory module, which has been described with reference to FIG. 1.

As will be apparent from FIG. 3, the potentials of the ground lines of the first, second and third memory modules are maintained at a substantially ground level prior to the change of the $\overline{CAS}$ signal from the high logic level to the low logic level. Further, the potentials of the ground lines of the first, second and third memory modules change in sequences substantially different from each other after a time t3 at which the $\overline{CAS}$ signal has been brought to the low logic level. That is, the waveform 301 indicative of the variation in potential of the ground line of the first memory module changes in a seventh sequence whose maximum peak in the positive direction, owing to positive voltage noises given by the memory devices, occurs after 16 ns have elapsed since the time t3. Further, the waveform 303 representative of the variation in potential of the ground line of the second memory module changes in an eighth sequence whose maximum positive peak occurs after 6 ns have elapsed since the time t3. Furthermore, the waveform 305 indicative of the variation in potential of the ground line of the third memory module changes in a ninth sequence whose maximum positive peak occurs after 9 ns have elapsed since the time t3.

As has been described above using FIGS. 1 through 3, the voltage noises developed in the ground lines of the first and second memory modules, for example, which employ memory devices with different maximum access times $t_{RAC}$ from each other, have different sequences. Owing to differences in the circuit design and production process of the memory devices which are mounted on the second and third memory modules, these modules also have different noise sequences on the ground lines even through they employ memory devices with identical maximum access times $t_{RAC}$. This is because the timing for operating the circuitry of each memory device varies according to the circuit design and the stray capacitance which exist inside each memory device varies depending on the production process.

Further, if the memory devices differ in kind (e.g., 4MDRAM and 1MDRAM) or if a change in the generation of development is made (i.e., a reduction or shrinkage in chip size), the voltage noises and ground noises generated when each memory device is activated are different in magnitude or level and waveform and the noise-producing timing changes, i.e., the noise-producing sequences become different.

It is thus considered that differences in the magnitude and waveform between respective voltage noises that are generated when different kinds of memory devices are operated and the difference in voltage-noise timing cause interference in a memory module product composed of mixed memory devices (e.g., 4MDRAM and 1MDRAM) which are different in kind from each other and which are mounted on a single substrate, as in memory devices referred to as a "three chip pack" or "multi-nine". This will now be described in further detail. Let's consider a memory module having two DRAMs indicated by "A" and a single DRAM indicated by "B," where "A" and "B" are memory devices different in kind from each other. Let's now assume that "A" outputs a high logic level. In this case, negative- going noises are developed in a ground line in a manner similar to the result of the test shown in FIG. 2. Since the ground lines of "A" and "B" are used in common on a module substrate different from that employed in the invention of the present application, to be described later, the potential of each ground line goes negative (i.e. goes to ground level or less) owing to the negative-going noises produced by "A". If a control signal which is 0.8V in level is supplied to the module from the outside of the module, the peak value of the negative-going noise level is −0.4V, and if "B" mounted on the module takes in the input control signal at the moment that the peak value has reached −0.4V, the level of the control signal virtually goes to 0.8V −(−0.4V)=1.2V. Accordingly, the guaranteed value of a low input level of the DRAM normally remains at 0.8V and hence B tends to malfunction. At this time, "A" mounted on the module is brought to a state immediately after having output data. Thus, "A" does not malfunction because it does not take in the control signal.

FIG. 4 is a block diagram showing the arrangement of a memory module 400 according to a first embodiment of the present invention. The memory module 400 is a 1 Mega-word by 9 bit DRAM module having two 4MDRAMs 401, 403 and a single 1MDRAM 405 normally mounted thereon, and is referred to as a so-called "three chip pack". A printed circuit board 410 is formed by printing voltage terminals Vcc1, Vcc2 (each supplied with a power source voltage of 5V), ground terminals Vss1, Vss2 (each supplied with a ground potential or voltage of 0V) and external connecting terminals (serving as a plurality of signal terminals) on a substrate for the printed circuit board 410. Address signal input terminals A0 through A9, a row address strobe terminal $\overline{RAS}$, a column address strobe terminal $\overline{CAS}$, a column address strobe terminal $\overline{CAS}$ for a parity bit, data input/output terminals DQ1 through DQ8, a data input terminal D9 for the parity bit, a data output terminal Q9 for the parity bit and a non-connecting terminal NC are fabricated on the substrate as the signal terminals referred to above. These external connecting terminals ar respectively electrically connected to corresponding conductive patterns of an unillustrated motherboard through a connector (not shown). For example, the voltage terminals Vcc1, Vcc2 are respectively electrically connected to a 5V external power supply through the motherboard and are maintained at a potential level of 5V. Further, the ground terminals Vss1, Vss2 are respectively electrically connected to a 0V external power supply through the motherboard and are maintained at a potential level of 0V. Furthermore, the printed circuit board 410 is provided, on the substrate for the printed circuit board 410, with a common voltage line 411, a first separate ground line 413, a second separate ground line 415 and unillustrated signal lines for connecting other signal terminals to respective lead terminals of the 4MDRAMs 401, 403 and/or the 1MDRAM 405.

For example, two 1 Mega-word×4 bit 4MDRAMs 401, 403 and a single 1 Mega-word×1 bit 1MDRAM 405 are mounted on the printed circuit board 410. These DRAMs 401, 403, 405 are ICs which are accommodated in surface mount type packages or the like. Voltage lead terminals of the DRAMs 401, 403, 405 are electrically connected to the voltage terminals Vcc1, Vcc2 through the common voltage line 411.

Next, the pin assignment of lead terminals (or lead pins) of the DRAMs 401, 403, 405 will be described with reference to FIGS. 5 and 6.

A DRAM 500 shown in FIG. 5 has a pin assignment which is typical of each of the 4MDRAMs 401, 403. The DRAM 500 includes a voltage lead terminal Vcc, a ground lead terminal Vss, input/output data lead terminals DQ1 through DQ4, address input lead terminals A0 through A9, a $\overline{RAS}$ (control) signal input lead terminal $\overline{RAS}$, a $\overline{CAS}$ (control) signal input lead terminal $\overline{CAS}$, a write enable (control) lead terminal $\overline{WE}$ and output enable (control) lead terminal $\overline{OE}$.

On the other hand, a DRAM 600 shown in FIG. 6 has the pin assignment of the 1MDRAM 405. The DRAM 600 includes a voltage lead terminal Vcc, a ground lead terminal Vss, an input data lead terminal Din, an output data lead terminal Dout, address input lead terminals A0 through A9, a $\overline{RAS}$ (control) signal input lead terminal $\overline{RAS}$, a $\overline{CAS}$ (control) signal input lead terminal $\overline{CAS}$, a write enable (control) lead terminal $\overline{WE}$ and a plurality of non-connecting lead terminals NC.

Accordingly, the electrical connection between the respective DRAMs 401, 403, 405 each having such a pin assignment and the connecting terminals provided on the substrate for the printed circuit board 410 shown in FIG. 4 is made as follows by means of the normally-used printed lines or patterns on an unillustrated substrate.

First of all, the input/output data lead terminals DQ1 through DQ4 of the DRAM 401 are electrically connected in parallel to their corresponding connecting terminals DQ1 through DQ4 on the substrate. Furthermore, the input/output data lead terminals DQ1 through DQ4 of the DRAM 403 are electrically connected in parallel to their corresponding connecting terminals DQ5 through DQ8 provided on the substrate. The input data lead terminal Din of the DRAM 405 is electrically connected to a connecting terminal D9 on the substrate, and the output data lead terminal Dout thereof is electrically connected to a connecting terminal Q9 on the substrate.

Further, the address input lead terminals A0 through A9 of each of the DRAMs 401, 403, 405 are electrically connected to their corresponding connecting terminals A0 through A9 on the substrate by means of ten common address printed patterns.

The $\overline{RAS}$ signal input lead terminal $\overline{RAS}$ of each of the DRAMs 401, 403, 405 is electrically connected to its corresponding connecting terminal $\overline{RAS}$ on the substrate by means of a common printed pattern.

The $\overline{CAS}$ signal input lead terminal $\overline{CAS}$ of each of the DRAMs 401, 403 is electrically connected to its corresponding connecting terminal $\overline{CAS}$ on the substrate by a common printed pattern. On the other hand, the $\overline{CAS}$ signal input lead terminal $\overline{CAS}$ of the DRAM 405 is electrically connected to its corresponding connecting terminal $\overline{CAS9}$ on the substrate by means of a printed pattern.

The write enable signal terminal $\overline{WE}$ of each of the DRAMs 401, 403, 405 is electrically connected via a common printed pattern to its corresponding connecting terminal $\overline{WE}$ on the substrate.

Further, the non-connecting lead terminals NC and the non-connecting terminals NC provided on the substrate are mutually brought to a non-connected state (an electrically floating state).

Furthermore, the output enable (control) lead terminals $\overline{OE}$ of the DRAMs 401, 403 are respectively connected to the first separate ground line 413 by means of printed patterns on the substrate.

The printed circuit board 410 shown in FIG. 4 has the common voltage line 411, the first separate ground line 413 and the second separate ground line 415, all of which are provided on the substrate for the printed circuit board 410. The voltage lead terminals Vcc of the DRAMs 401, 403, 405 are respectively connected to the voltage terminals Vcc1, Vcc2 through the common voltage line 411.

As has been described with reference to FIGS. 1 through 3, the 401, 403 and the 1MDRAM 405 respectively have different noise-producing sequences in which a change in the strength or level and waveform of the noise and a change in the noise-producing timing occur owing to differences in the circuit design of the memory devices and in the production process, for example. The ground lead terminals Vss of the DRAMs 401 and 403, which have substantially the same noise-producing sequence, are electrically connected to the ground terminal Vss1 through the first separate ground line 413. On the other hand, the ground lead terminal of the DRAM 405 is electrically connected to the ground terminal Vss2 through the second separate ground line 415. Accordingly, the first separate ground line and the second separate ground line are electrically separated and insulated from each other on the printed circuit board 410. Therefore, ground noises produced by either one of the DRAMs 401, 403, serving as one group which produces ground noises substantially at the same timing, and the DRAM 405, which generates ground noises at a timing different from that employed in the above group, do not allow the other DRAM to malfunction.

Figure 7:
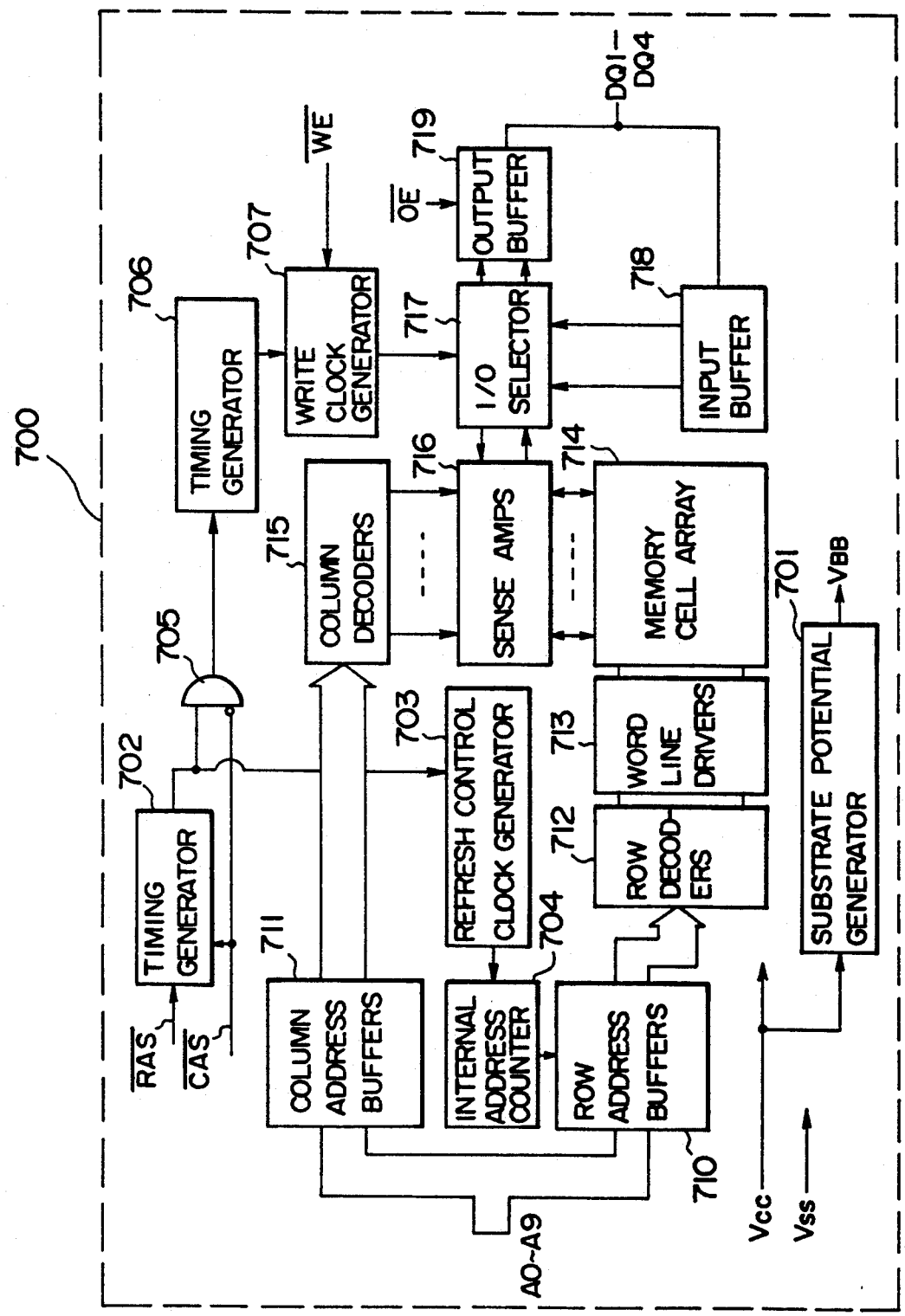
FIG. 7 is a schematic block diagram showing the structure of a typical DRAM employed in the memory module shown in FIG. 4.

FIG. 7 is a schematic block diagram showing a typical configuration of each of the 4MDRAMs 401, 403 illustrated in FIG. 4. Incidentally, the 1MDRAM 401 is quite similar in structure to the 4MDRAM and will not therefore be illustrated.

The 4MDRAM 700 includes a substrate potential generator 701 for generating a substrate potential VBB in response to a power supply voltage applied to a voltage lead terminal Vcc, a timing clock generator 702 for generating a timing clock signal in response to control signals input to a $\overline{RAS}$ signal input lead terminal $\overline{RAS}$ and a $\overline{CAS}$ signal input lead terminal $\overline{CAS}$, a refresh control clock generator 703 for generating a refresh control clock signal in response to the timing clock signal, and an internal address counter 704 for counting the number of internal addresses in response to the refresh control clock. Further, the DRAM 700 has an AND gate 705 for ANDing the timing clock output from the timing clock generator 702 and a signal obtained by inverting the control signal supplied from the $\overline{CAS}$ signal input lead terminal $\overline{CAS}$, a timing clock generator 706 for generating a timing clock signal in response to the output of the AND gate 705, and a write clock generator 707 activated in response to a signal supplied from a write enable lead terminal $\overline{WE}$ to thereby generate a write clock signal based on the timing clock signal. A row address buffer 710 which is activated in response to the signal input to the $\overline{RAS}$ signal input lead terminal $\overline{RAS}$ and a column address buffer 711 which is activated in response to the signal input to the $\overline{CAS}$ (control) signal input lead terminal $\overline{CAS}$ are electrically connected to address terminals A0 through A9. Word lines of a memory cell array 714 are electrically connected to the output of the row address buffer 710 through a row decoder 712 and a word driver 713. Bit lines of the memory cell array 714 are electrically connected to the output of the column address buffer 711 through a column decoder 715 and a sense amplifier 716. Further, an input buffer 718 and an output buffer 719 are electrically connected to the bit lines through an input/output selector (hereinafter called an "I/O selector") 717 and are also electrically connected to data input/output terminals DQ1 through DQ4.

This type of 4MDRAM 700 initiates an operation based on the $\overline{RAS}$ signal in response to the falling edge of the signal input to the $\overline{RAS}$ signal input lead terminal $\overline{RAS}$, for example, and starts to effect an operation based on the $\overline{CAS}$ signal in response to the falling edge of the signal input to the $\overline{CAS}$ signal input lead terminal $\overline{CAS}$.

The operation based on the $\overline{RAS}$ signal is effected as follows. When the signal applied to the $\overline{RAS}$ signal input lead terminal falls, the row address buffer 710 is activated to produce an output therefrom. Then, the row decoder 712 is activated in response to the output of the row address buffer 710 to operate the word line driver 713, thereby driving a single word line of the word lines of the memory cell array 714. A difference signal corresponding to the level of each memory cell is produced between the respective bit lines of the memory cell array 714 owing to the driving of the word line. The difference signal is amplified by the sense amplifier 716 so as to be brought to either "0" or "1".

After the operation based on the $\overline{RAS}$ signal has been completed, the operation based on the $\overline{CAS}$ signal, which is controlled in accordance with the signal supplied to the $\overline{CAS}$ signal input lead terminal $\overline{CAS}$, is effected. Under the operation based on the $\overline{CAS}$ signal, the writing and reading of data into and from the memory cell array 714 are effected in response to the signal input to the write enable lead terminal $\overline{WE}$. When the signal supplied to the $\overline{CAS}$ signal input lead terminal $\overline{CAS}$ falls, for example, the column address buffer 711 is activated to produce an output therefrom. The column decoder 715 is then activated in response to the output of the column address buffer 711 so as to select, as data, a signal representing the difference in potential between the adjacent bit lines, which has been amplified by the sensse amplifier 716. The selected data is output to the data input/output terminals DQ1 through DQ4 through the I/O selector 717 controlled based on the output of the write clock generator 707 and the output buffer 719. On the other hand, data input from the data input/output terminals DQ1 through DQ4 are amplified by the input buffer 718 upon writing of the data into the memory cell array 714. Thereafter, the amplified data are transmitted to the sense amplifier 716 through the I/O selector 717 and written into the memory cell array 714.

In order to activate the memory module shown in FIG. 4, which has been constructed as described above, for example, a voltage of 5V is supplied to the voltage terminals Vcc1, Vcc2 and a voltage of 0V is supplied to the ground terminals Vss1, Vss2. Further, an address signal common to each of the DRAMs 401, 403, 405 is input to each of the address terminals A0 through A9. Furthermore, a control clock signal common to each of the DRAMs 401, 403, 405 is input to each of the $\overline{RAS}$ (control) signal input lead terminal $\overline{RAS}$ and the $\overline{CAS}$ (control) signal input lead terminal $\overline{CAS}$. As a result, each of the DRAMs 401, 403, 405 can read an address signal input to each of the address input lead terminals A0 through A9 in response to the input control clock signal so as to write data input from each of the data input/output terminals DQ1 through DQ8 into a predetermined address, or read data from the predetermined address so as to be output to each of the data input/output terminals DQ1 through DQ8.

Now, a voltage range for guaranteeing the operation of each of the DRAMs which have been described above, is set to Vcc=5V±10% (4.5V to 5.5V). The DRAMs are operated under the recommendable operating conditions shown in the following table.

TABLE

| Items | Symbols | Minimum | Standard | Maximum | Unit |
|---|---|---|---|---|---|
| Power source voltage | Vcc | 4.5 | 5.0 | 5.5 | volt (V) |
|  | Vss | 0 | 0 | 0 | volt (V) |
| High (H) logic level input voltage | Vih | 2.4 | — | 6.5 | volt (V) |
| Low (L) logic level input voltage | Vil | −1.0 | — | 0.8 | volt (V) |

According to the recommendable operating conditions shown in the Table referred to above, if the input voltage is 2.4V or more, it can be then determined that the input voltage is "H" in level. If, on the other hand, the input voltage is 0.8V or less, it can be then determined that the input voltage is "L" in level. Thus, when the power source voltage Vcc is 5V, the "H" level of the input voltage indicates that 2.6V is left as a margin as seen from the power source voltage Vcc. On the other hand, the "L" level of the input voltage shows that only 0.8V is left as a margin as seen from the power source voltage Vss. Therefore, there is sometimes a situation in which, when positive noises are developed, a suitable decision cannot be effected. In order to solve this problem, the aforementioned first embodiment of the present invention separates the ground lines on the substrate.

Further, DRAMs which can be operated at a power source voltage Vcc of 3V will be manufactured in the future. In this case, it is considered that the "H" level of the input voltage will not provide a sufficient margin as seen from the power source voltage Vcc (3V). In order to cope with such a situation, second and third embodiments as shown below will now be described.

Figure 8:
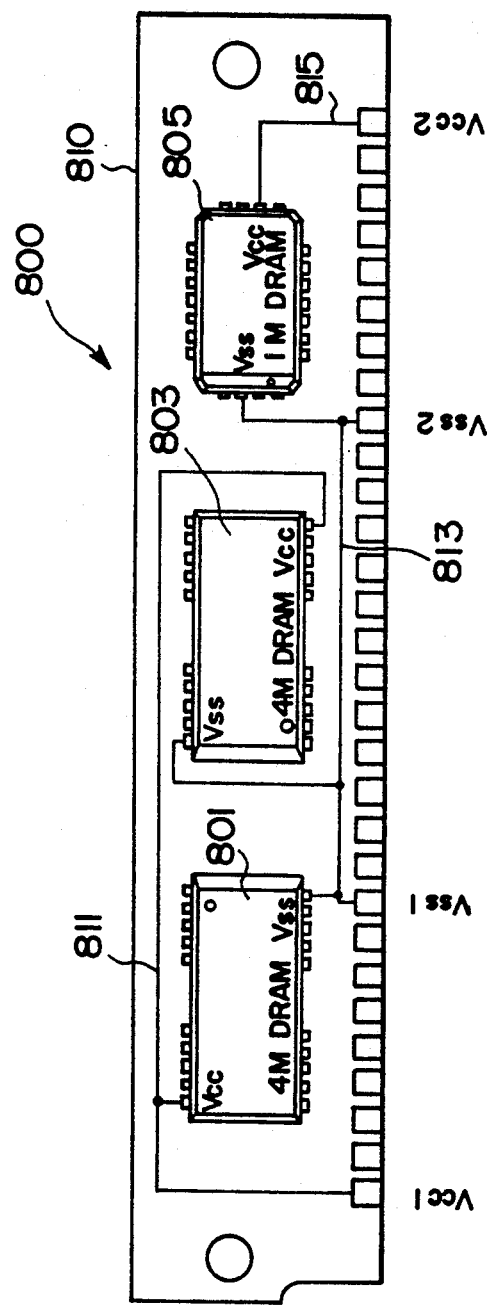
FIG. 8 is a functional block diagram showing the structure of a memory module according to a second embodiment of the present invention.

FIG. 8 is a block diagram showing the structure of a memory module 800 according to the second embodiment of the present invention.

The memory module 800 is a 1 Mega-word×9 bit DRAM module having two 4MDRAMs 801, 803 and a single 1MDRAM 805 mounted thereon in a manner similar to the first embodiment of the present invention. A printed circuit board 810 is fabricated by printing voltage terminals Vcc1, Vcc2 (each supplied with a power source voltage of 3V), ground terminals Vss1, Vss2 (each supplied with a ground potential or voltage of 0V) and external connecting terminals (serving as a plurality of signal terminals) on a substrate for the printed circuit board 810 in a manner similar to the first embodiment. Further, the printed circuit board 810 is provided, on the substrate for the printed circuit board 810, with a first separate voltage line 811, a second separate voltage line 815, a common ground line 813 and unillustrated signal lines for connecting other signal terminals to respective lead terminals of the 4MDRAMs 801, 803 and/or 1MDRAM 805. Furthermore, the printed circuit board 810 includes two 1 Mega-word×4 bit 4MDRAMs 801, 803 and a single 1 Mega-word×1 bit 1MDRAM 805, all of which are mounted thereon in a manner similar to the first embodiment.

The ground lead terminals Vss of the DRAMs 801, 803, 805 are electrically connected to the ground terminals Vss1, Vss2 through the common ground line 813.

As has been described with reference to FIGS. 1 through 3, the 4MDRAMs 801, 803 and the 1MDRAM 805 have different noise-producing sequences in which a change in the strength or level and waveform of the noise and a change in the noise-producing timing occur owing to differences in the circuit design of the memory devices and in the production process, for example. Accordingly, each of the voltage lead terminals Vcc of the DRAMs 801, 803, which have substantially the same noise-producing sequence, is electrically connected to the ground terminal Vcc1 through the first separate voltage line 811. On the other hand, a voltage lead terminal Vcc of the DRAM 805 is electrically connected to the voltage terminal Vcc2 through the second separate voltage line 815. Thus, the first separate voltage line and the second separate voltage line are electrically separated and insulated from each other on the printed circuit board. Therefore, voltage noises produced by either one of the DRAMs 801, 803 (serving as one group which produces voltage noises substantially at the same timing) and the DRAM 805 (which generates voltage noises at a timing different from that of the above group) do not cause the other DRAM to malfunction. The arrangement of the memory module according to the second embodiment would be adversely influenced by noises on the voltage lines but the influence of noises on the ground lines is relatively low.

Figure 9:
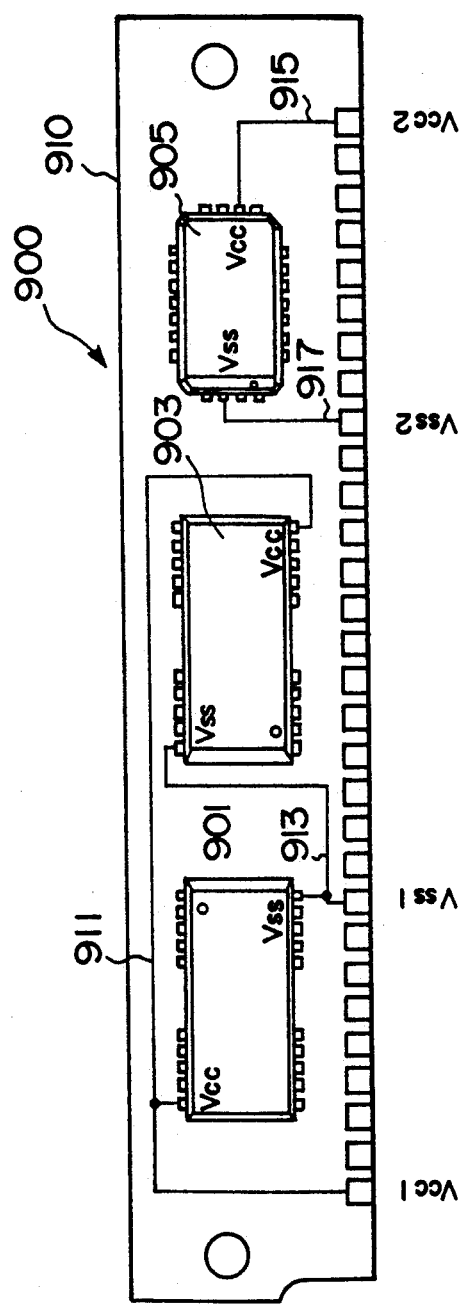
FIG. 9 is a functional block diagram illustrating the structure of a memory module according to a third embodiment of the present invention.

FIG. 9 is a block diagram showing the structure of a memory module 900 according to a third embodiment 10 of the present invention.

The memory module 900 is a 1 Mega-word×9 bit DRAM module having two 4MDRAMs 901, 903 and a single 1MDRAM 905 mounted thereon in a manner similar to the first embodiment of the present invention. A printed circuit board 910 is fabricated by printing voltage terminals Vcc1, Vcc2 (each supplied with a power source voltage of 3V), ground terminals Vss1, Vss2 (each supplied with a ground potential or voltage of 0V) and external connecting terminals (serving as a plurality of signal terminals) on a substrate for the printed circuit board 910 in a manner similar to the first embodiment. Further, the printed circuit board 910 is provided, on the substrate for the printed circuit board 910, with a first separate voltage line 911, a second separate voltage line 915, a first separate ground line 913, a second separate ground line 917 and unillustrated signal lines for connecting other connecting terminals to respective lead terminals of the 4MDRAMs 901, 903 and/or 1MDRAM 905. Furthermore, the printed circuit board 910 includes two 1 Mega-word×4 bit 4MDRAMs 901, 903 and a single 1 Mega-word×1 bit 1MDRAM 905, all of which are mounted thereon in the same manner as the first embodiment.

As has been described above using FIGS. 1 through 3, the 4MDRAMs 901, 903 and the 1MDRAM 905 have different noise-producing sequences in which a change in the strength or level and waveform of the noise and a change in the noise-producing timing occur owing to differences in the circuit design of the memory devices and in the production process, for example. Therefore, each of the voltage lead terminals Vcc of the DRAMs 901, 903, which have substantially the same noise-producing sequence, is electrically connected to the voltage terminal Vcc1 through the first separate voltage line 911. Further, the ground lead terminals Vss of the DRAMs 901, 903 are electrically connected to the ground terminal Vss1 via the first separate ground line 913. On the other hand, the voltage lead terminal Vcc of the DRAM 905 is electrically connected to the voltage line Vcc2 through the second separate voltage line 915, whereas the ground lead terminal Vss thereof is electrically connected to the ground terminal Vss2 through the third separate ground line 917. Thus, the first and second separate voltage lines and the first and second separate ground lines are respectively electrically separated and insulated from each other on the printed circuit board. Therefore, noises produced by either one of the DRAMs 901, 903 (serving as one group which produces noises substantially at the same timing) and the DRAM 905 (which generates noises at a timing different from that of the above group) do not cause the other DRAM to malfunction.

While the invention has been particularly shown and described with reference to the preferred embodiments thereof, it will be understood by those skilled in the art that various changes in form and details may be made therein without departing from the spirit and scope of the invention.

For example, bare memory chips can directly be mounted on the printed circuit board instead of memory devices employing plastic molded packages.

What is claimed is:

1. A memory module, comprising:
a printed circuit board having a common address line and first and second separate voltage lines, said printed circuit board further having first and second voltage terminals which are to be respectively maintained at a first predetermined potential, said first and second voltage terminals being respectively connected to said first and second separate voltage lines;

a first memory device, mounted on said printed circuit board, having a first data lead terminal, a first control input lead terminal, a first address input lead terminal and a first voltage lead terminal, said first address input lead terminal being connected to said common address line and said first voltage lead terminal being connected to said first separate voltage line, said first memory device applying first voltage noises to said first separate voltage line in a first sequence when said first memory device is being accessed; and a second memory device, mounted on said printed circuit board, having a second data lead terminal, a second control input lead terminal, a second address input lead terminal and a second voltage lead terminal, said second address input lead terminal being connected to said common address line and said second voltage lead terminal being connected to said second separate voltage line, said second memory device applying second voltage noises to said second separate voltage line in a second sequence when said second memory device is being accessed, said second sequence being substantially different from said first sequence.

2. The module, according to claim 1, wherein said printed circuit board further includes a plurality of access terminals for providing access to said first data and control input lead terminals of said first memory device and said second data and control lead input terminals of said second memory device.

3. The module according to claim 2, wherein said first separate voltage line varies in potential with respect to the first predetermined potential in response to the first voltage noises regardless of the second voltage noises; and wherein said second separate voltage line varies in potential with respect to the first predetermined potential in response to the second voltage noises regardless of the first voltage noises.

4. The module according to claim 1, wherein said printed circuit board further has a common voltage line; wherein said printed circuit board additionally has third and fourth voltage terminals which are to be maintained at a second predetermined potential, said common voltage line connecting said third and fourth voltage terminals; wherein said first memory device has a third voltage lead terminal which is connected to said common voltage line; and wherein said second memory device has a fourth voltage lead terminal which is connected to said common voltage line.

5. The module according to claim 4, wherein said printed circuit board additionally has a plurality of access terminals for providing access to said first data and control input lead terminals of said first memory device and said second data and control input lead terminals of said second memory device.

6. The module according to claim 5, wherein said first separate voltage line varies in potential with respect to the first predetermined potential in response to the first voltage noises regardless of the second voltage noises; and wherein said second separate voltage line varies in potential with respect to the first predetermined potential in response to the second voltage noises regardless of the first voltage noises.

7. The module according to claim 1, wherein said printed circuit board further has third and fourth separate voltage lines; wherein said printed circuit board additionally has third and fourth voltage terminals which are to be respectively maintained at a second predetermined potential, said third and fourth voltage terminals being respectively connected to said third and fourth separate voltage lines; wherein said first memory device has a third voltage lead terminal which is connected to said third separate voltage line; and wherein said second memory device has a fourth voltage lead terminal which is connected to said fourth separate voltage line.

8. The module according to claim 7, wherein said first memory device additionally applies third voltage noises to said third separate voltage line when said first memory device is being accessed; wherein said second memory device additionally applies fourth voltage noises to said fourth voltage line when said second memory device is being accessed; wherein said first separate voltage line varies in potential with respect to the first predetermined potential in response to the first voltage noises regardless of the second voltage noises; wherein said second separate voltage line varies in potential with respect to the first predetermined potential in response to the second voltage noises regardless of the first voltage noises; wherein said third separate voltage line varies in potential with respect to the second predetermined potential in response to the third voltage noises regardless of the fourth voltage noises; and wherein said fourth separate voltage line varies in potential with respect to the fourth predetermined potential in response to the fourth voltage noises regardless of the third voltage noises.

9. A memory module, comprising:
a printed circuit board having a common address line and first and second separate voltage lines, said printed circuit board further having first and second voltage terminals which are to be respectively maintained at a first predetermined potential, said first and second voltage terminals being respectively connected to said first and second separate voltage lines;
a first memory chip, mounted on said printed circuit board, having a first data electrode, a first control input electrode, a first address input electrode and a first voltage electrode, said first address input electrode being connected to said common address line and said first voltage electrode being connected to said first separate voltage line, said first memory chip applying first voltage noises to said first separate voltage line in a first sequence when said first memory chip is being accessed; and
a second memory chip, mounted on said printed circuit board, having a second data electrode, a second control input electrode, a second address input electrode and a second voltage electrode, said second address input electrode being connected to said common address line and said second voltage electrode being connected to said second separate voltage line, said second memory chip applying second voltage noises to said second separate voltage line in a second sequence when said second memory chip is being accessed, said second sequence being substantially different from said first sequence.

10. The module according to claim 9, wherein said printed circuit board further includes a plurality of access terminals for providing access to said first data and control input electrodes of said first memory chip and said second data and control input electrodes of said second memory chip.

11. The module according to claim 10, wherein said first separate voltage line varies in potential with respect to the first predetermined potential in response to the first voltage noises regardless of the second voltage noises; and wherein said second separate voltage line varies in potential with respect to the first predetermined potential in response to the second voltage noises regardless of the first voltage noises.

12. The module according to claim 9, wherein said first separate voltage line varies in potential with respect to the first predetermined potential in response to the first voltage noises regardless of the second voltage noises; and wherein said second separate voltage line varies in potential with respect to the first predetermined potential in response to the second voltage noises regardless of the first voltage noises.

13. The module according to claim 9, wherein said printed circuit board further has a common voltage line; wherein said printed circuit board additionally has third and fourth voltage terminals which are to be maintained at a second predetermined potential, said common voltage line connecting said third and fourth voltage terminals; wherein said first memory chip has a third voltage electrode which is connected to said common voltage line; and wherein said second memory chip has a fourth voltage electrode which is connected to said common voltage line.

14. The module, according to claim 13, wherein said printed circuit board additionally has a plurality of access terminals for providing access to said first data and control input electrodes of said first memory chip and said second data and control input electrodes of said second memory chip.

15. The module according to claim 14, wherein said first separate voltage line varies in potential with respect to the first predetermined potential in response to the first voltage noises regardless of the second voltage noises; and wherein said second separate voltage line varies in potential with respect to the first predetermined potential in response to the second voltage noises regardless of the first voltage noises.

16. The module according to claim 9, wherein said printed circuit board further has third and fourth separate voltage lines; wherein said printed circuit board additionally has third and fourth voltage terminals which are to be respectively maintained at a second predetermined potential, said third and fourth voltage terminals being respectively connected to said third and fourth separate voltage lines; wherein said first memory chip has a third voltage electrode which is connected to said third separate voltage line; and wherein said second memory chip has a fourth voltage electrode which is connected to said fourth separate voltage line.

17. The module according to claim 16, wherein said first memory chip additionally applies third voltage noises to said third separate voltage line when said first memory chip is being accessed; wherein said second memory chip additionally applies fourth voltage noises to said fourth voltage line when said second memory chip is being accessed; wherein said first separate voltage line varies in potential with respect to the first predetermined potential in response to the first voltage noises regardless of the second voltage noises; wherein said second separate voltage line varies in potential with respect to the first predetermined potential in response to the second voltage noises regardless of the first voltage noises; wherein said third separate voltage line varies in potential with respect to the second predetermined potential in response to the third voltage noises regardless of the fourth voltage noises; and wherein said fourth separate voltage line varies in potential with respect to the fourth predetermined potential in response to the fourth voltage noises regardless of the third voltage noises.

18. The module according to claim 1, wherein said first separate voltage line varies in potential with respect to the first predetermined potential in response to the first voltage noises regardless of the second voltage noises; and wherein said second separate voltage line varies in potential with respect to the first predetermined potential in response to the second voltage noises regardless of the first voltage noises.

19. A memory module, comprising:
first, second, and third IC memories, each of the memories having a first power supply conductor for receiving electrical power at a first potential and a second power supply conductor for receiving electrical power at a second potential to operate the respective memory; and
a printed circuit board on which the memories are mounted, the printed circuit board including a row of terminals, the terminals in the row including first, second, and third terminals, the printed circuit board additionally including first connecting means for electrically connecting the first terminal to the first power supply conductors of the first and second memories, second connecting means for electrically connecting the second terminal to the second power supply conductors of the first and second memories, and third connecting means for electrically connecting the third terminal to one of the power supply conductors of the third memory, the third connecting means being electrically isolated on the printed circuit board from the first and second terminals and the first and second connecting means.

20. The memory module of claim 19, wherein the row of terminals additionally includes a fourth terminal, wherein the first connecting means further comprises means for electrically connecting the first terminal to the fourth terminal and to the first power supply conductor of the third memory, and wherein the third connecting means electrically connects the third terminal to the second power supply conductor of the third memory.

21. The memory module of claim 19, wherein the row of terminals additionally includes a fourth terminal, wherein the second connecting means further comprises means for electrically connecting the second terminal to the fourth terminal and to the second power supply conductor of the third memory, and wherein the third connecting means electrically connects the third terminal to the first power supply conductor of the third memory.

22. The memory module of claim 19, wherein the row of terminals additionally includes a fourth terminal, and wherein the printed circuit board further comprises fourth connecting means for electrically connecting the fourth terminal to the other of the power supply conductors of the third memory, the fourth connecting means being electrically isolated on the printed circuit board from the first, second, and third terminals and from the first, second, and third connecting means.

23. The memory module of claim 19, wherein the first memory has a manufacturer's model number, wherein the second memory has a manufacturer's model number that is the same as the model number of the first memory, and wherein the third memory has a manufacturer's model number that is different from the model number of the first memory.

* * * * *